United States Patent
Lee et al.

(10) Patent No.: US 8,177,486 B2
(45) Date of Patent: May 15, 2012

(54) FAN FRAME

(75) Inventors: Pei-Chuan Lee, Ping Tung (TW);
Ming-Che Lee, Ping Tung (TW)

(73) Assignee: Adda Corp., Ping Tung (TW)

( * ) Notice: Subject to any disclaimer, the term of this patent is extended or adjusted under 35 U.S.C. 154(b) by 965 days.

(21) Appl. No.: 12/178,190

(22) Filed: Jul. 23, 2008

(65) Prior Publication Data

US 2010/0020493 A1    Jan. 28, 2010

(51) Int. Cl.
*F04D 13/04* (2006.01)
(52) U.S. Cl. ....... 415/66; 415/68; 415/213.1; 415/214.1
(58) Field of Classification Search ............ 415/66, 415/68, 213.1, 214.1
See application file for complete search history.

(56) References Cited

U.S. PATENT DOCUMENTS

| | | | |
|---|---|---|---|
| 6,827,549 B1 * | 12/2004 | Horng et al. | 415/68 |
| 7,168,912 B2 * | 1/2007 | Sun | 415/66 |
| 7,331,759 B1 * | 2/2008 | Tejeda | 415/221 |
| 7,465,151 B2 * | 12/2008 | Hong et al. | 415/119 |
| 7,585,150 B2 * | 9/2009 | Hsu et al. | 415/213.1 |
| 7,654,792 B2 * | 2/2010 | Kikuichi et al. | 415/68 |

* cited by examiner

*Primary Examiner* — Jarrett Stark
*Assistant Examiner* — Nicholas Tobergte
(74) *Attorney, Agent, or Firm* — Pai Patent & Trademark Law Firm; Chao-Chang David Pai

(57) ABSTRACT

A fan frame has at least one protrudent connector and at least one recessed connector. The at least one protrudent connector is formed on a corner of a surface of the fan frame. The at least one recessed connector is formed on another corner of the same surface of the fan frame, opposite to the at least one protrudent connector and corresponding to the at least one protrudent connector of another same fan frame. Two fan frames can be securely connected against each other by engaging corresponding protrudent and recessed connectors.

6 Claims, 5 Drawing Sheets

FAN FRAME

BACKGROUND OF THE INVENTION

1. Field of the Invention

The present invention relates to a fan frame, especially to a fan frame that can be connected against another same fan frame quickly and easily.

2. Description of the Related Art

Electronic devices that generate high heat usually dissipate heat by at least one fan. In order to help accelerating heat convection, people may combine multiple small-sized fans as this may be more convenient than using a large-sized fan.

A conventional fan comprises a fan frame, a stator and a rotor. The stator and the rotor are mounted in the fan frame in sequence. The fan frame has multiple lugs having a through hole and disposed on corners of the fan frame. The lugs allow multiple conventional fans to be attached to each other by aligning the through holes of the lugs and screwing the lugs together with nuts and bolts. However, screwing the nuts and bolts is inconvenient, may be awkward and requires much time and work.

To overcome the shortcomings, the present invention provides a fan frame that can be connected against another same fan frame easily to mitigate or obviate the aforementioned problems.

SUMMARY OF THE INVENTION

The main objective of the invention is to provide a fan frame that can be connected against another same fan frame quickly and easily.

A fan frame has at least one protrudent connector and at least one recessed connector. The at least one protrudent connector is formed on a corner of a surface of the fan frame. The at least one recessed connector is formed on another corner of the same surface of the fan frame, opposite and corresponding to the at least one protrudent connector. Two fan frames can be securely connected against each other by engaging corresponding protrudent and recessed connectors.

Other objectives, advantages and novel features of the invention will become more apparent from the following detailed description when taken in conjunction with the accompanying drawings.

DETAILED DESCRIPTION OF THE PREFERRED EMBODIMENTS

Figure 2:
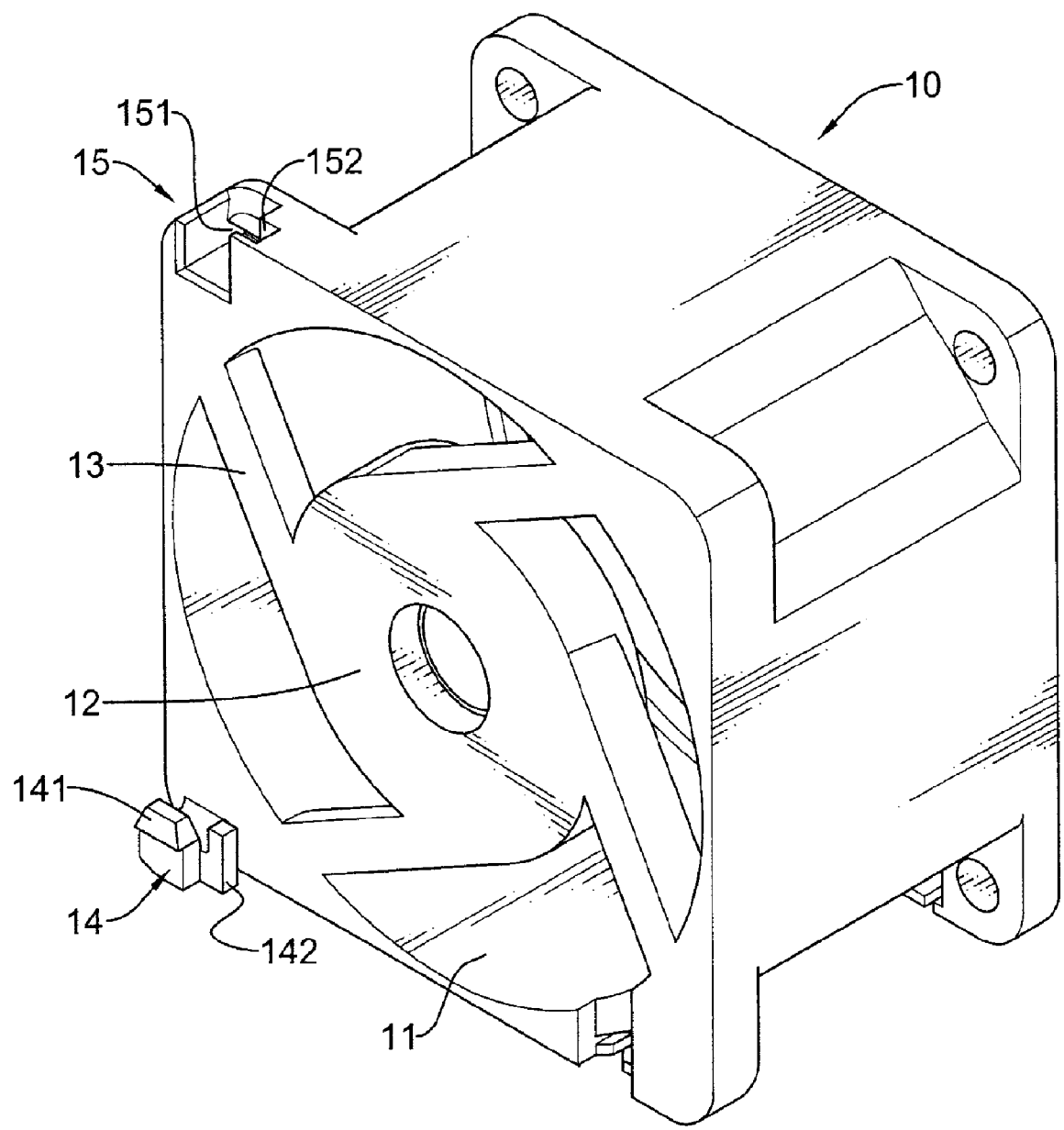
FIG. 2 is a perspective view of a second embodiment of a fan frame in accordance with the present invention.

With reference to FIG. 2, a fan frame (10) in accordance with the present invention comprises a front surface, a rear surface, an opening, an inner sidewall (11), an optional fan mount (12), multiple optional ribs (13), at least one protrudent connector (14) and at least one recessed connector (15).

The rear surface is opposite to the front surface and has multiple corners.

The opening is formed through the front surface and the rear surface of the fan frame (10).

The inner sidewall (11) is formed in the opening between the front surface and the rear surface.

The fan mount (12) is formed in the opening near the rear surface, is adapted to be attached with a stator and a rotor and has an outer sidewall.

The ribs (13) are formed on and protrude radially from the outer sidewall of the fan mount (12) and connect to the inner sidewall (11).

The at least one protrudent connector (14) is formed on a corner of the rear surface and may have a hook (141) and a guiding tab (142) adjacent to the hook (141).

The at least one recessed connector (15) is formed on another corner opposite the at least one protrudent connector (14), corresponds to the at least one protrudent connector (14) of another same fan frame, and may have a hook slot (151) and a notch (152). The hook slot (151) corresponds to the hook (141) of the at least one protrudent connector (14) of another same fan frame. The notch (152) is adjacent to the hook slot (151) and corresponds to the guiding tab (142) of the at least one protrudent connector (14) of another same fan frame.

Figure 1:
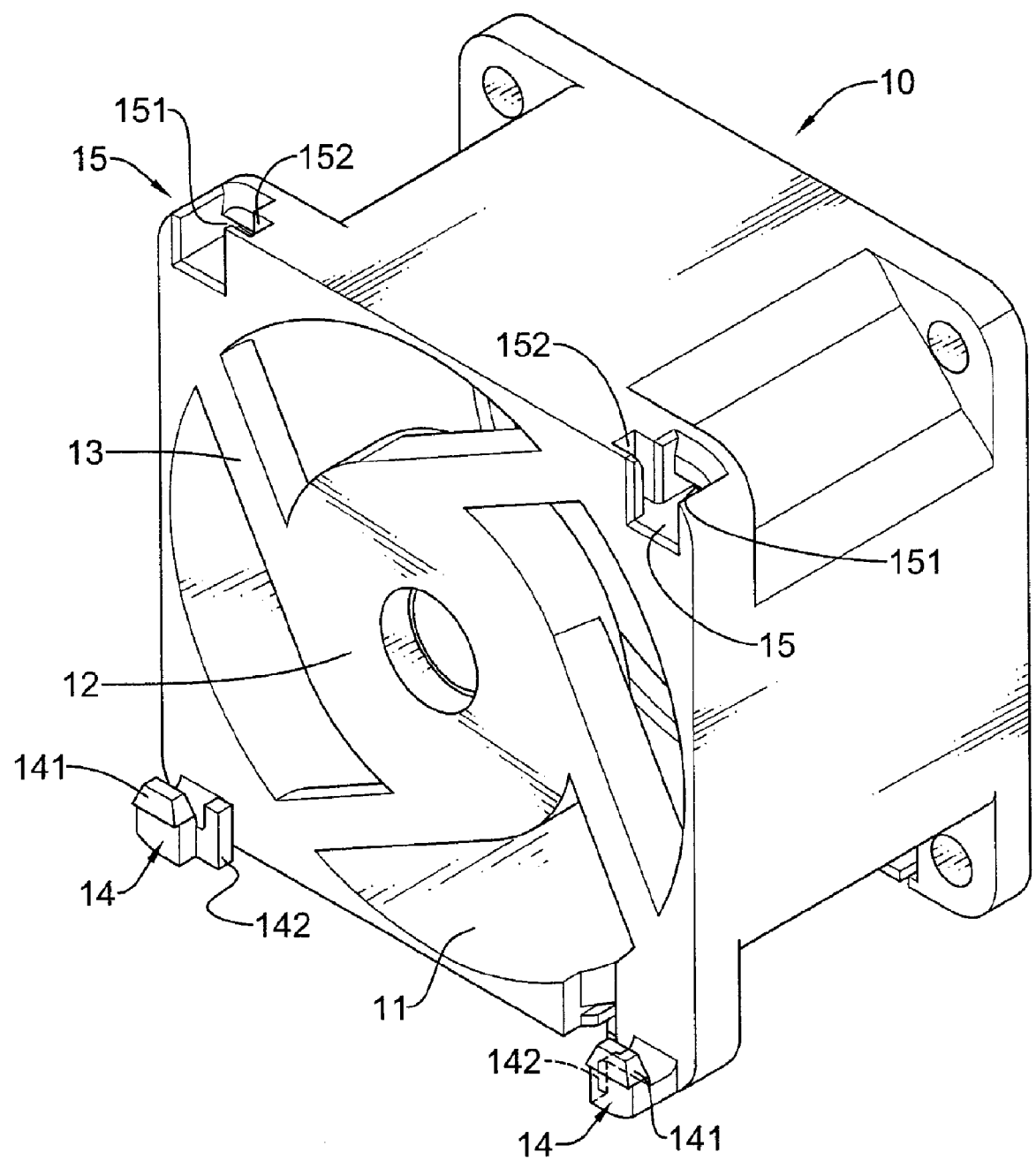
FIG. 1 is a perspective view of a first embodiment of a fan frame in accordance with the present invention.

With further reference to FIG. 1, in another embodiment of the present invention, two protrudent connectors (14) are implemented and are respectively formed on two corners of the rear surface. Two recessed connectors (15) are implemented and respectively formed on other two corners of the rear surface, opposite to the protrudent connectors (14).

Figure 3:
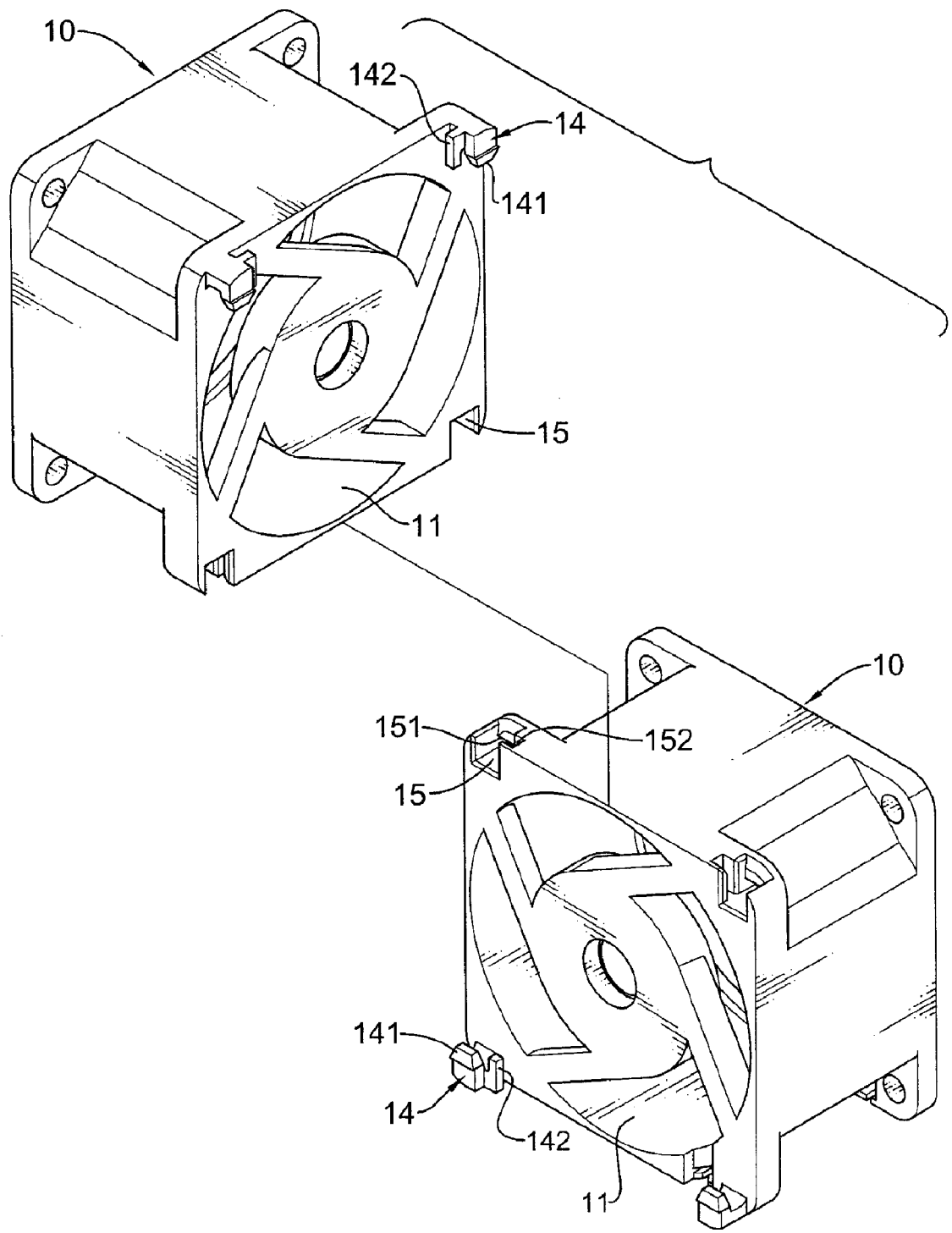
FIG. 3 is a perspective operational view of connecting two fan frames as in FIG. 1.
Figure 4:
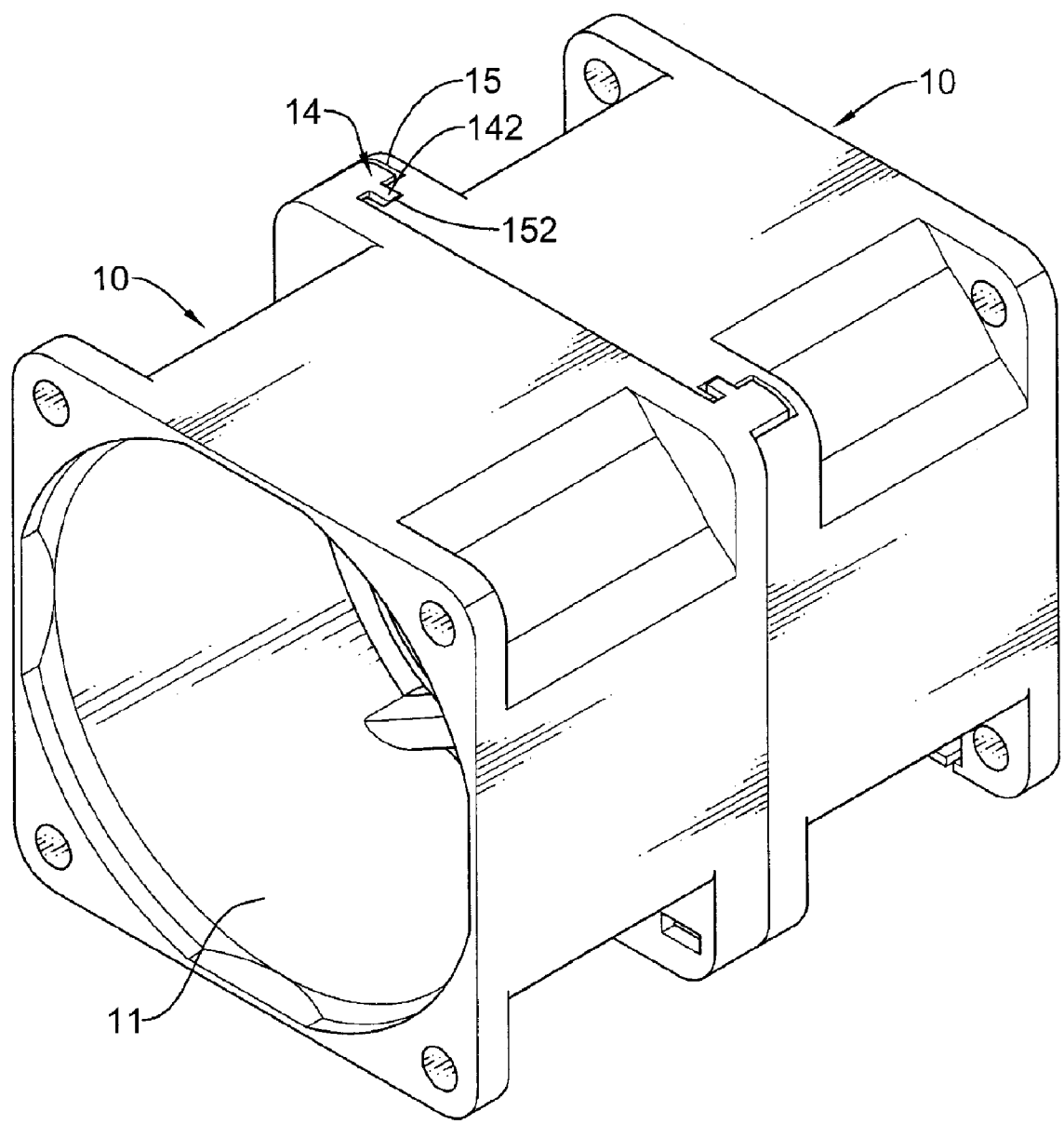
FIG. 4 is a perspective view of two fan frames in FIG. 3, shown combination.

With further reference to FIGS. 3 and 4 the protrudent connectors (14) and the recessed connectors (15) allow two fan frames (10) to be connected against each other by engaging one's protrudent connectors (14) and recessed connectors (15) respectively to the other's recessed connectors (15) and protrudent connectors (14). In detail, one fan frame (10) is turned upside down and has the hook (141) and guiding tab (142) of its protrudent connectors (14) respectively engaged with the corresponding hook slot (151) and notch (152) of the other's recessed connectors (15). Therefore the fan frames (10) can be connected against each other securely.

Furthermore, to allow more than two fan frames connected, the protrudent and recessed connectors (14, 15) formed on both of the front and rear surfaces of each fan frame are implemented.

Figure 5:
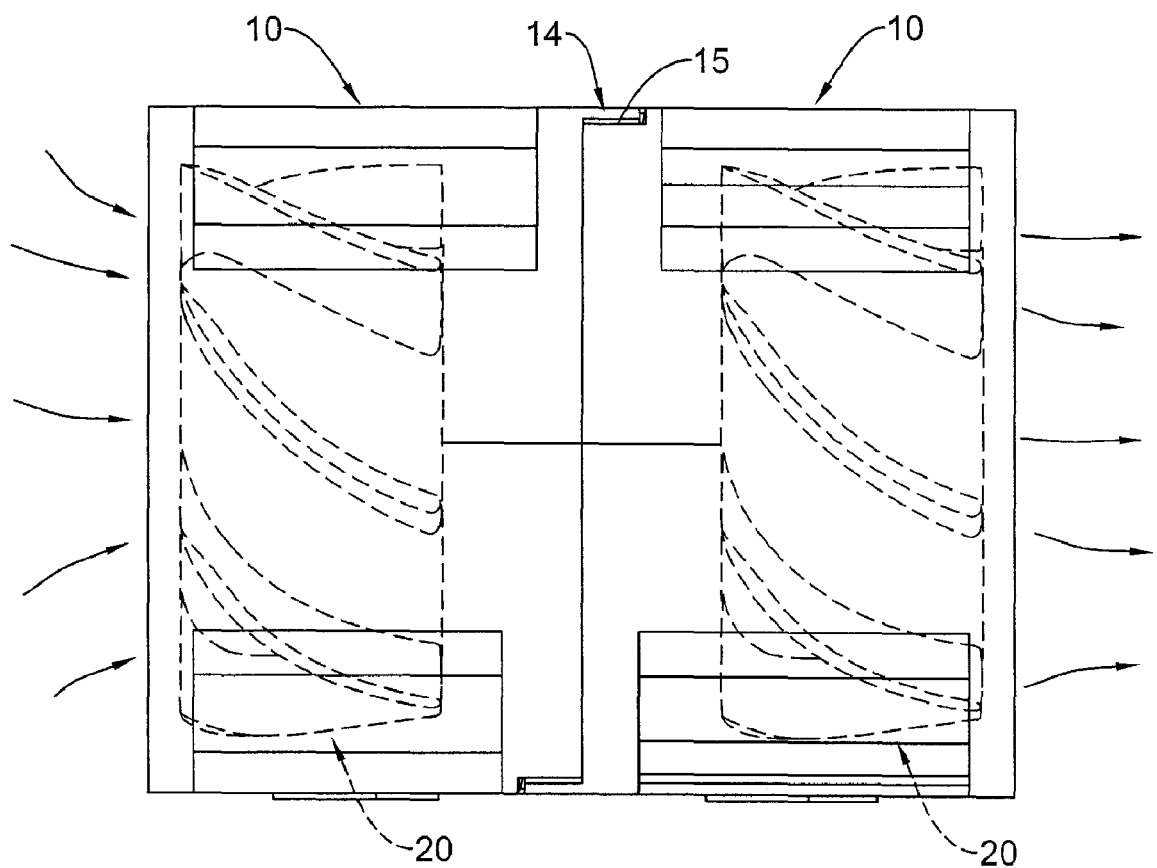
FIG. 5 is a top view of the fan frames in FIG. 4 respectively having rotors attached and shown in phantom lines.

With further reference to FIG. 5, when two rotors (20) of fans are respectively rotatably mounted on the fan frames (10) of the combination, rotating rotors (20) in same direction will enhance wind pressure to achieve good air ventilation.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A fan frame comprising:
   a front surface;
   a rear surface being opposite to the front surface and having multiple corners;
   an opening being formed through the front surface and the rear surface of the fan frame;

an inner sidewall being formed in the opening between the front surface and the rear surface;

two protrudent connectors being respectively formed on two corners of the rear surface; and two recessed connectors being respectively formed on other two corners of the rear surface and opposite to the two protrudent connectors and corresponding to the two protrudent connectors of another same fan frame.

2. The fan frame as claimed in claim 1, wherein each protrudent connector has a hook; and each recessed connector has a hook slot corresponding to the hook of another same fan frame.

3. The fan frame as claimed in claim 2, wherein each protrudent connector further has a guiding tab being adjacent to the hook; and each recessed connector further has a notch being adjacent to the hook slot and corresponding to the guiding tab of the at least one protrudent connector of another same fan frame.

4. The fan frame as claimed in claim 3 further comprising a fan mount being formed in the opening near the rear surface and having an outer sidewall; and multiple ribs being formed on and protruding radially from the outer sidewall of the fan mount and connecting to the inner sidewall of the fan frame.

5. A fan frame comprising:

a front surface;

a rear surface being opposite to the front surface and having multiple corners;

an opening being formed through the front surface and the rear surface of the fan frame;

an inner sidewall being formed in the opening between the front surface and the rear surface;

at least one protrudent connector being formed on a corner of the rear surface, and comprising a hook; and a guiding tab adjacent to the hook; and at least one recessed connector being formed on another corner opposite the at least one protrudent connector and corresponding to the at least one protrudent connector of another same fan frame, the at least one recessed connector comprising a hook slot corresponding to the hook of another same fan frame; and a notch adjacent to the hook slot that is corresponding to the guiding tab of the at least one protrudent connector of another same fan frame.

6. The fan frame as claimed in claim 5 further comprising:

a fan mount being formed in the opening near the rear surface and having an outer sidewall; and multiple ribs being formed on and protruding radially from the outer sidewall of the fan mount and connecting to the inner sidewall of the fan frame.

* * * * *